(12) United States Patent
Choi et al.

(10) Patent No.: US 11,193,627 B2
(45) Date of Patent: Dec. 7, 2021

(54) STAND AND DISPLAY APPARATUS INCLUDING THE SAME

(71) Applicant: SAMSUNG ELECTRONICS CO., LTD., Suwon-si (KR)

(72) Inventors: Dae Su Choi, Suwon-si (KR); Hyun Yong Choi, Suwon-si (KR); Min Sik Kim, Suwon-si (KR); Dae Sik Yoon, Suwon-si (KR); Hyun Jun Jung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/762,362

(22) PCT Filed: Sep. 4, 2018

(86) PCT No.: PCT/KR2018/010266
§ 371 (c)(1),
(2) Date: May 7, 2020

(87) PCT Pub. No.: WO2019/093639
PCT Pub. Date: May 16, 2019

(65) Prior Publication Data
US 2020/0355317 A1    Nov. 12, 2020

(30) Foreign Application Priority Data
Nov. 9, 2017    (KR) .................. 10-2017-0148549

(51) Int. Cl.
*F16M 11/24*     (2006.01)
*F16B 7/18*      (2006.01)
(Continued)

(52) U.S. Cl.
CPC .............. *F16M 11/24* (2013.01); *F16B 7/18* (2013.01); *H05K 5/0017* (2013.01);
(Continued)

(58) Field of Classification Search
CPC ........ F16M 11/24; F16M 11/22; F16M 11/04; F16M 2200/08; F16M 2200/027; G02F 1/13; F16B 7/18
See application file for complete search history.

(56) References Cited

U.S. PATENT DOCUMENTS 4,824,303 A  *  4/1989  Dinger ...................... F16B 2/14
                                                    254/104
5,232,304 A  *  8/1993  Huang ...................... F16B 7/025
                                                    403/374.4
(Continued)

FOREIGN PATENT DOCUMENTS

| GB | 2 452 507 | 3/2009 |
| KR | 10-2007-0047173 | 5/2007 |
| KR | 10-0800197 | 2/2008 |

OTHER PUBLICATIONS

International Search Report dated Jan. 7, 2019, in corresponding International Patent Application No. PCT/KR2018/010266.
(Continued)

*Primary Examiner* — Tan Le
(74) *Attorney, Agent, or Firm* — Staas & Halsey, LLP

(57) ABSTRACT

The present disclosure relates to a stand having an improved structure to stably support a display module and a display apparatus including the same. The stand includes a base, a support bar on which the display module is mounted, the support bar including an opening and being coupled to the base, and a movement preventing unit configured to reduce a gap between the base and the support bar and including a moving block configured to protrude through the opening to be in contact with an inner surface of the base.

7 Claims, 13 Drawing Sheets

(51) Int. Cl.
*H05K 5/02* (2006.01)
*H05K 5/00* (2006.01)
*F16M 11/00* (2006.01)

(52) U.S. Cl.
CPC .......... *H05K 5/0234* (2013.01); *F16M 11/00* (2013.01); *F16M 2200/08* (2013.01)

(56) References Cited

U.S. PATENT DOCUMENTS

| | | | |
|---|---|---|---|
| 5,269,622 A | 12/1993 | Mullenberg | |
| 5,290,122 A * | 3/1994 | Hulme | H05K 7/1404 165/80.2 |
| 5,382,175 A * | 1/1995 | Kunkel | H05K 7/1404 29/525.09 |
| 5,407,297 A * | 4/1995 | Hulme | H05K 7/1404 403/24 |
| 5,442,973 A | 8/1995 | Liao | |
| 6,099,199 A | 8/2000 | Mullenberg | |
| 6,796,446 B2 * | 9/2004 | Segall | A47G 25/0664 211/204 |
| 6,796,536 B1 | 9/2004 | Sevier, IV | |
| 7,398,952 B2 * | 7/2008 | Carnevali | F16B 7/14 248/404 |
| 2008/0035805 A1 | 2/2008 | Carnevali | |
| 2011/0233351 A1 | 9/2011 | Foster | |

OTHER PUBLICATIONS

Extended European Search Report dated Oct. 15, 2020 from European Application No. 18877100.0, 7 pages.

* cited by examiner

STAND AND DISPLAY APPARATUS INCLUDING THE SAME

CROSS-REFERENCE TO RELATED APPLICATIONS

This application is a U.S. National Stage Application which claims the benefit under 35 U.S.C. § 371 of International Patent Application No. PCT/KR2018/010266 filed on Sep. 4, 2018, which claims foreign priority benefit under 35 U.S.C. § 119 of Korean Patent Application No. 10-2017-0148549 filed on Nov. 9, 2017 in the Korean Intellectual Property Office, the contents of both of which are incorporated herein by reference.

TECHNICAL FIELD

The present disclosure relates to a stand and a display apparatus including the same, and more particularly, to a stand having an improved structure to stably support a display module and a display apparatus including the same.

BACKGROUND ART

A display apparatus is a type of an output apparatus that visually displays data information such as characters and graphics, and images or the like.

The display apparatus may include a self-light emitting display panel, such as an organic light-emitting diode (OLED), or a light-receiving/emitting display panel, such as a liquid crystal display (LCD).

The display apparatus may further include a stand to support the display panel. The stand may include a base and a support bar coupled to the base to allow the display panel to be mounted.

When the coupling between the base and the support bar constituting the stand is not secured, the support bar coupled to the base may be shaken. As such, when the support bar is shaken, the display panel mounted on the support bar may also be shaken, which may cause inconvenience to a user. In addition, the display panel may be damaged by falling to a floor due to an unsecured coupling between the base and the support bar of the stand.

DISCLOSURE

Technical Problem

The present disclosure is directed to providing a stand having an improved structure to prevent shaking and a display apparatus including the same.

Technical Solution

One aspect of the present disclosure provides a stand configured to support a display module. The stand may include a base, a support bar on which the display module is mounted, the support bar including an opening and being coupled to the base, and a movement preventing unit configured to reduce a gap between the base and the support bar and including a moving block configured to protrude through the opening to be in contact with an inner surface of the base.

The movement preventing unit may further include a guide block including an inclined surface along which the moving block moves.

The guide block may be positioned below the moving block in a height direction H of the stand, and the inclined surface of the guide block may be inclined upward in the height direction H of the stand with respect to a protruding direction X of the moving block.

The guide block may include a first guide block positioned below the moving block in a height direction H of the stand and including a first inclined surface inclined upward in the height direction H of the stand with respect to a protruding direction X of the moving block, and a second guide block positioned above the moving block in the height direction H of the stand and including a second inclined surface inclined downward in the height direction H of the stand with respect to the protruding direction X of the moving block.

The movement preventing unit may further include a coupling pin penetrating the moving block and the guide block to prevent at least one of the moving block and the guide block from being separated from the support bar through the opening.

A coupling hole in which the coupling pin is coupled and which is open lengthwise along the protruding direction X of the moving block may be formed on the moving block.

Male threads may be formed on an outer surface of the coupling pin, and female threads engaged with the male threads may be formed on an inner surface of the support bar.

A coupling portion to which the support bar is inserted and coupled may be provided on the base, and the moving block may protrude through the opening to be in contact with an inner surface of the coupling portion when the movement preventing unit is pressed upward in a height direction H of the stand.

The base may include a coupling portion configured to allow the support bar to be inserted and coupled and an insertion hole formed on a bottom surface thereof, and the moving block may protrude through the opening to be in contact with an inner surface of the coupling portion when the movement preventing unit is pressed by a tool inserted in the insertion hole.

The stand may further include a fixing member configured to couple the base and the support bar, wherein the fixing member may be coupled to a fixing hole formed on the bottom surface of the base to be adjacent to the insertion hole.

A coupling portion to which the support bar is inserted and coupled may be provided on the base, the coupling portion of the base may include a first end facing upward in a height direction H of the stand and a second end facing downward in the height direction H of the stand, and the moving block may protrude through the opening to be in contact with the first end of the coupling portion or an inner surface of the coupling portion adjacent to the first end of the coupling portion.

The movement preventing unit may be disposed inside the support bar.

Another aspect of the present disclosure provides a stand configured to support a display module. The stand may include a base including a coupling portion, a support bar elongated along a height direction H of the stand to allow the display module to be mounted, the support bar including an opening and being inserted into and coupled to the coupling portion, and a movement preventing unit disposed inside the support bar and including a moving block configured to protrude through the opening to be in contact with an inner surface of the coupling portion when the movement preventing unit is pressed upward in a height direction H of the stand.

An insertion hole may be formed on a bottom surface of the base, and the movement preventing unit may be pressed upward in the height direction H of the stand by a tool inserted into the insertion hole.

The movement preventing unit may further include a guide block including an inclined surface along which the moving block moves.

The guide block may include a first guide block positioned below the moving block in the height direction H of the stand and including a first inclined surface inclined upward in the height direction H of the stand with respect to a protruding direction X of the moving block, and a second guide block positioned above the moving block in the height direction H of the stand and including a second inclined surface inclined downward in the height direction H of the stand with respect to the protruding direction X of the moving block.

An accommodation space in which the movement preventing unit is accommodated may be provided inside the support bar, and the upward movement of the second guide block in the height direction H of the stand may be restricted by interference with a locking jaw formed on an inner surface of the support bar.

The movement preventing unit may further include a coupling pin penetrating the moving block and the guide block to prevent at least one of the moving block and the guide block from being separated from the support bar through the opening.

The coupling pin may include a first portion to which the moving block and the guide block are coupled and a second portion extending from the first portion to be positioned below the first portion in the height direction H of the stand, and male threads corresponding to female threads formed on an inner surface of the support bar may be formed on an outer surface of the second portion.

Another aspect of the present disclosure provides a display apparatus including a display module configured to display an image and a stand configured to allow the display module to be mounted. The stand may include a base, a support bar coupled to the base and configured to allow the display module to be mounted, and a movement preventing unit positioned between the base and the support bar to reduce a gap between the base and the support bar and including a moving block configured to protrude to be in contact with an outer surface of the support bar or an inner surface of the base.

Advantageous Effects

A movement preventing unit comprising a guide block and a moving block configured to selectively bring into contact with an outer surface of a support bar or an inner surface of a base through interaction with the guide block is applied, so that a gap between the base and the support bar can be reduced to effectively prevent a stand from shaking.

MODE OF THE INVENTION

Hereinafter, embodiments of the present disclosure will be described in detail with reference to the accompanying drawings. The terms "front end," "rear end," "upper portion," "lower portion," "upper end" and "lower end" used in the following description are defined with reference to the drawings, and the shape and position of each component are not limited by these terms.

Figure 1:
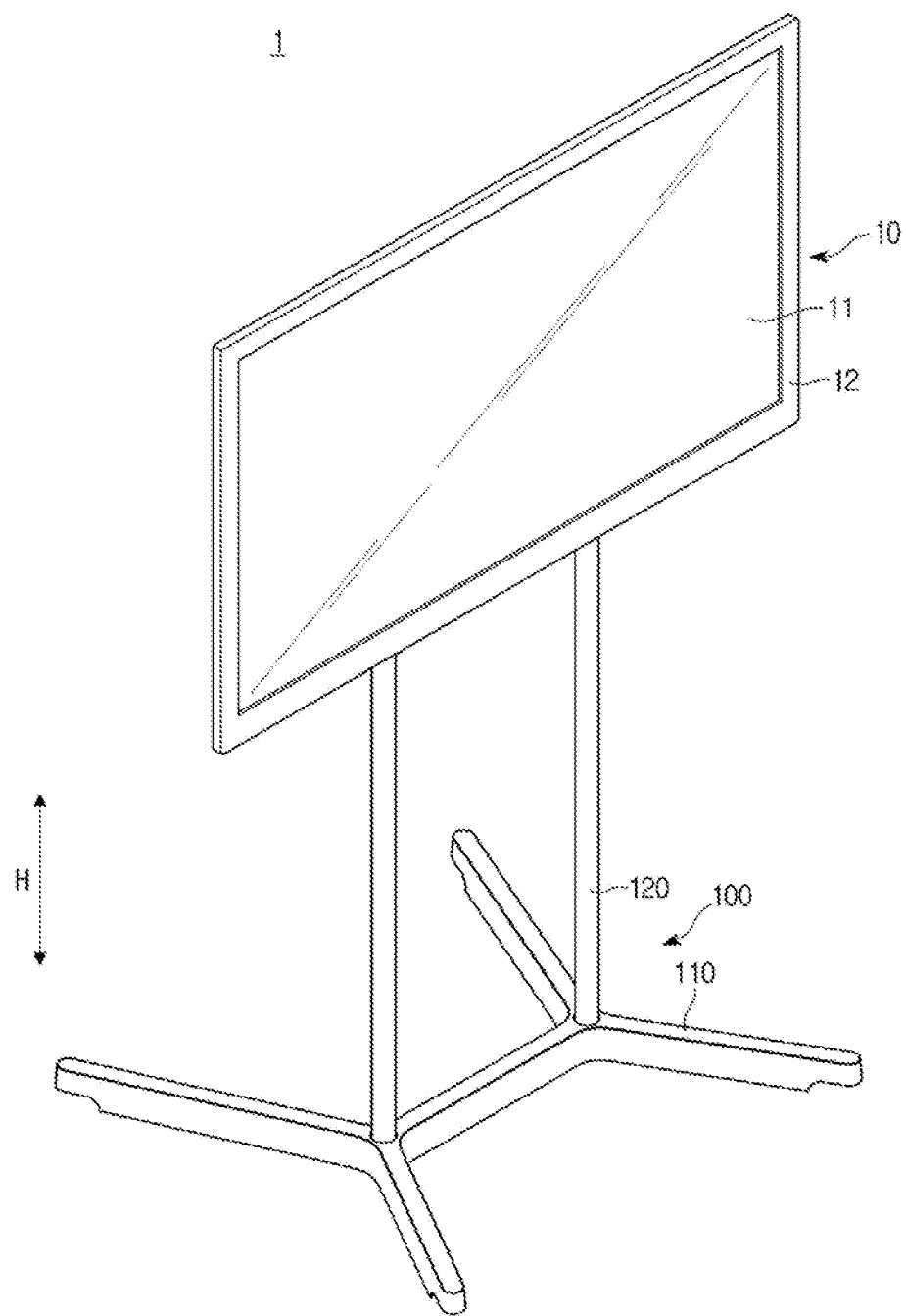
FIG. 1 is a perspective view of a display apparatus according to an embodiment of the present disclosure.
Figure 7:
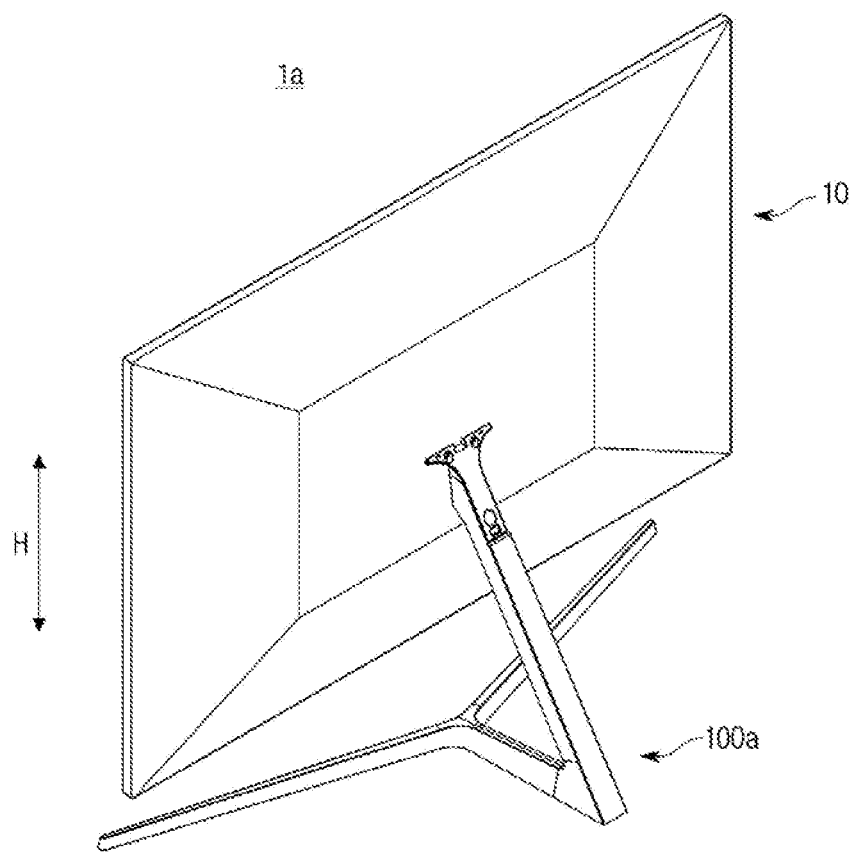
FIG. 7 illustrates a display apparatus according to another embodiment of the present disclosure.

Hereinafter, various embodiments of a display apparatus will be described with reference to the accompanying drawings. FIG. 1 illustrates an electronic blackboard as an example, and FIG. 7 illustrates a television as an example. A display apparatus is sufficient as long as it may display an image, and the type of display apparatus is not limited to an electronic blackboard and a television.

FIG. 1 is a perspective view of a display apparatus according to an embodiment of the present disclosure. Description of reference numbers not described through FIG. 1 will be made through FIG. 2.

As illustrated in FIG. 1, a display apparatus 1 may include a display module 10 configured to display an image. The display module 10 may include a display panel 11 on which an image is displayed, a display unit (not shown) configured to form an image, and a frame 12 accommodating the display panel 11 and the display unit and forming an outer appearance of the display module 10.

The display panel 11 may include a self-light emitting display panel, such as an organic light-emitting diode (OLED), or a light-receiving/emitting display panel, such as a liquid crystal display (LCD).

When the display panel 11 is a light-receiving/emitting display panel, the display unit may include a backlight unit (BLU) (not shown) configured to supply light to the display panel 11.

The display panel 11 may be implemented as a touch screen method.

The display apparatus 1 may further include a stand 100 configured to allow the display module 10 to be mounted. That is, the stand 100 may be configured to support the display module 10. A detailed description of the stand 100 will be described later.

Figure 2:
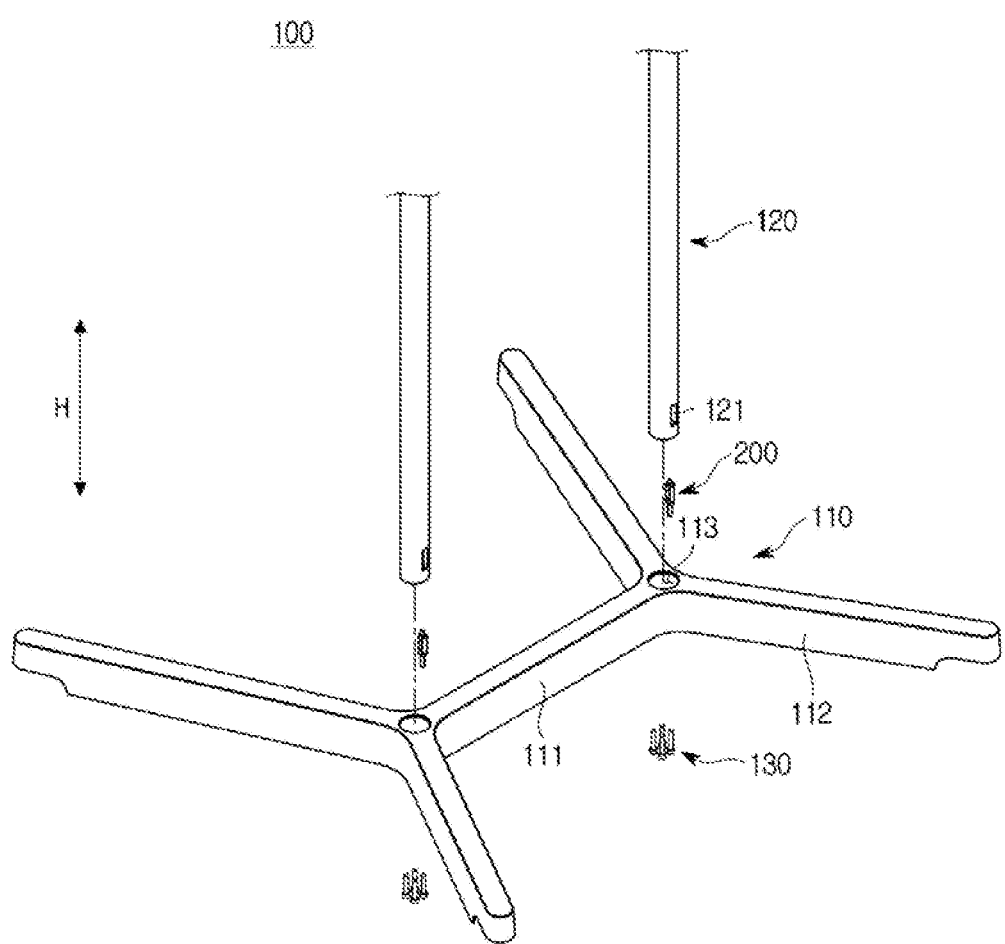
FIG. 2 is an exploded perspective view of a stand of the display apparatus according to an embodiment of the present disclosure.

FIG. 2 is an exploded perspective view of a stand of the display apparatus according to an embodiment of the present disclosure.

As illustrated in FIG. 2, the stand 100 may include a base 110 disposed on an installation surface. The base 110 may include a base body 111 and a plurality of legs 112 extending in four directions from the base body 111.

The base 110 may further include a coupling portion 113 configured to allow a support bar 120 to be inserted. The coupling portion 113 may be recessed in the base 110 to have a certain depth. Specifically, the coupling portion 113 may be recessed in the base body 111 to have a certain depth. The number and shape of the coupling portions 113 may correspond to the number and shape of the support bars 120 inserted into the coupling portions 113.

The stand 100 may further include the support bar 120 elongated along a height direction H of the stand 100. The support bar 120 may be coupled to the base 110. The support bar 120 may be inserted into the coupling portion 113. Specifically, the support bar 120 may be fixedly coupled to the base 110 in a state of being inserted into the coupling portion 113 by a fixing member 130, which will be described later. The support bar 120 may have a column shape elongated along the height direction H of the stand 100. However, the shape of the support bar 120 is not limited to the above example, and may be variously changed.

The display module 10 may be mounted on the support bar 120. That is, a holder (not shown) on which the display module 10 is mounted may be provided on the support bar 120. Specifically, the holder may be fixed to the support bar 120, and the display module 10 may be mounted on the holder. That is, the display module 10 may be mounted on the support bar 120 through the holder.

A shelf (not shown) may be provided on the stand 100 for the convenience of the user. It is appropriate that the shelf is mounted on the support bar 120. As an example, the user may place an electronic product, such as a laptop or DVD player for use in a presentation or conference, on the shelf.

The support bar 120 may include an opening 121. The opening 121 may be formed on a side surface of the support bar 120 to face an inner surface of the coupling portion 113 when the support bar 120 is inserted into the coupling portion 113. A portion of a movement preventing unit 200, which will be described later, may protrude through the opening 121 to be in contact with the inner surface of the coupling portion 113.

The stand 100 may further include the fixing member 130 configured to couple the base 110 and the support bar 120. As an example, the fixing member 130 may include a screw. The fixing member 130 may couple the base 110 and the support bar 120 in the height direction H of the stand 100. Specifically, the fixing member 130 may couple the base 110 and the support bar 120 in the height direction H of the stand 100 by being coupled to a bottom surface of the base 110 so as not to be exposed to the outside. The fixing member 130 may be coupled to a fixing hole (not shown) formed on the bottom surface of the base 110. The shape and number of the fixing holes may correspond to the shape and number of the fixing members 130 coupled to the fixing holes. The fixing hole may be formed on the bottom surface of the base 110 to be adjacent to an insertion hole 114, which will be described later.

The stand 100 may further include the movement preventing unit 200 configured to reduce a gap between the base 110 and the support bar 120. Specifically, the stand 100 may further include the movement preventing unit 200 configured to reduce a gap between the coupling portion 113 and the support bar 120. The movement preventing unit 200 may be positioned between the support bar 120 and the base 110. That is, the movement preventing unit 200 may be positioned between the support bar 120 and the coupling portion 113 of the base 110. As an example, the movement preventing unit 200 may be provided on the support bar 120. Specifically, the movement preventing unit 200 may be disposed inside the support bar 120. However, the position of the movement preventing unit 200 is not limited to the support bar 120, and may be variously changed. As an example, the movement preventing unit 200 may be provided on the base 110. Hereinafter, a description will be given focusing on a case where the movement preventing unit 200 is provided on the support bar 120. When the coupling between the base 110 and the support bar 120 is not secured, the stand 100 may be shaken. In particular, as the gap between the coupling portion 113 of the base 110 and the support bar 120 increases, the degree of shaking of the stand 100 may increase. The shaking of the stand 100 may cause inconvenience to the user and may lead to a safety accident. The movement preventing unit 200 may effectively prevent the shaking of the stand 100, especially the shaking of the support bar 120, by minimizing the gap between the coupling portion 113 of the base 110 and the support bar 120. A detailed description of the movement preventing unit 200 will be described later.

Figure 3:
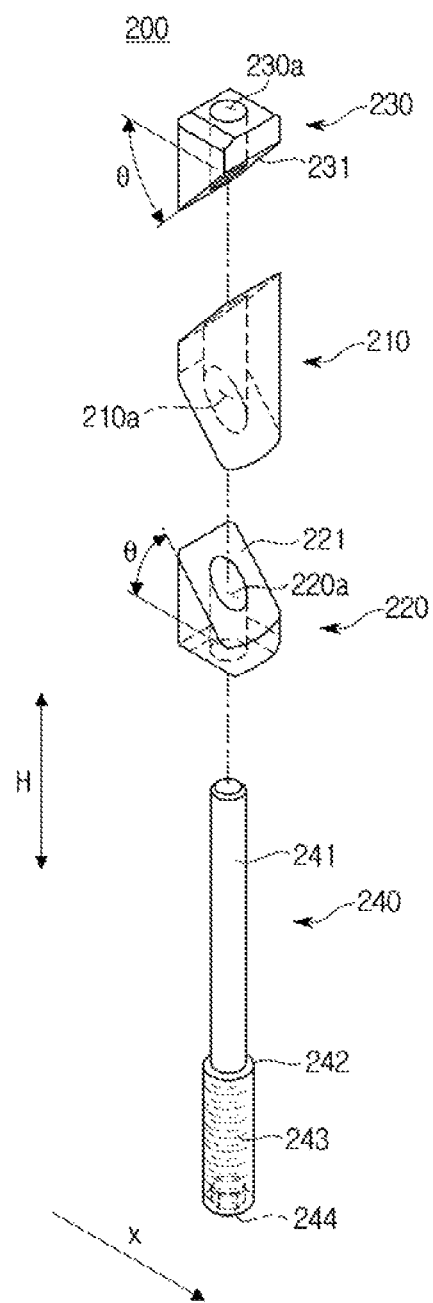
FIG. 3 is an exploded perspective view of a movement preventing unit according to a first embodiment in the stand of the display apparatus according to an embodiment of the present disclosure.

FIG. 3 is an exploded perspective view of a movement preventing unit according to a first embodiment in the stand of the display apparatus according to an embodiment of the present disclosure.

As illustrated in FIG. 3, the movement preventing unit 200 may include a moving block 210. The moving block 210 may protrude to be in contact with an outer surface of the support bar 120 or an inner surface of the base 110. Specifically, the moving block 210 may protrude to be in contact with the outer surface of the support bar 120 or the inner surface of the coupling portion 113 of the base 110. When the movement preventing unit 200 is disposed inside the support bar 120, the moving block 210 may protrude through the opening 121 to be in contact with the inner surface of the base 110. Specifically, the moving block 210 may protrude through the opening 121 to be in contact with the inner surface of the coupling portion 113. The moving block 210 may protrude through the opening 121 through interaction with the guide block. However, when the movement preventing unit 200 is configured to form an outer appearance of the support bar 120 or is provided on the outside of the support bar 120, the moving block 210 may protrude to be in contact with the inner surface of the coupling portion 113. In this case, the opening 121 may be omitted.

The moving block 210, may be provided with a coupling hole 210a to which a coupling pin 240, which will be described later, is coupled. The coupling hole 210a may have an open lengthwise shape along a protruding direction X of the moving block 210. The shape of the coupling hole 210a of the moving block 210 enables the movement of the moving block 210.

The movement preventing unit 200 may further include a guide block having an inclined surface along which the moving block 210 moves.

The guide block may include a first guide block 220 positioned below the moving block 210 in the height direction H of the stand 100. The first guide block 220 may include a first inclined surface 221 inclined upward in the height direction H of the stand 100 with respect to the protruding direction X of the moving block 210.

A coupling hole 220a to which the coupling pin 240, which will be described later, is coupled may be formed on the first guide block 220. A cross-sectional shape of the coupling hole 220a facing upward in the height direction H of the stand 100 and a cross-sectional shape of the coupling hole 220a facing downward in the height direction H of the stand 100 may be different from each other. Specifically, a cross section of the coupling hole 220a facing upward in the height direction H of the stand 100 may have an open lengthwise shape along the protruding direction X of the moving block 210. That is, the cross section of the coupling hole 220a of the first guide block 220 facing the moving block 210 may have an open lengthwise shape along the protruding direction X of the moving block 210. On the other hand, a cross section of the coupling hole 220a facing downward in the height direction H of the stand 100 may have a shape corresponding to the coupling pin 240.

The guide block may further include a second guide block 230 positioned above the moving block 210 in the height direction H of the stand 100. The second guide block 230 may face the first guide block 220 with the moving block 210 interposed therebetween. The second guide block 230 may include a second inclined surface 231 inclined downward in the height direction H of the stand 100 with respect to the protruding direction X of the moving block 210.

A coupling hole 230a to which the coupling pin 240, which will be described later, is coupled may be formed on the second guide block 230. A cross-sectional shape of the coupling hole 230a facing upward in the height direction H of the stand 100 and a cross-sectional shape of the coupling hole 230a facing downward in the height direction H of the stand 100 may be different from each other. Specifically, a cross section of the coupling hole 230a facing upward in the height direction H of the stand 100 may have a shape corresponding to the coupling pin 240. On the other hand, a cross section of the coupling hole 230a facing downward in the height direction H of the stand 100 may have an open lengthwise shape along the protruding direction X of the moving block 210. That is, the cross section of the coupling hole 230a of the second guide block 230 facing the moving block 210 may have an open lengthwise shape along the protruding direction X of the moving block 210.

The movement preventing unit 200 may further include the coupling pin 240 connecting the moving block 210 and the guide block. The coupling pin 240 may penetrate the moving block 210 and the guide block to prevent at least one of the moving block 210 and the guide block from being separated from the support bar 120 through the opening 121. The coupling pin 240 may have a pin shape elongated along the height direction H of the stand 100. The coupling pin 240 may be fastened to the coupling hole 220a of the first guide block 220 of the moving block 210, the coupling hole 210a of the moving block 210, and the coupling hole 230a of the second guide block 230.

The coupling pin 240 may include a first portion 241 to which the moving block 210 and the guide block are coupled, and a second portion 242 extending from the first portion 241 to be positioned below the first portion 241 in the height direction H of the stand 100. The first portion 241 and the second portion 242 may have different widths. The second portion 242 may have a wider width than the first portion 241.

Male threads 243 may be formed on an outer surface of the coupling pin 240. Specifically, the male threads 243 may be formed on an outer surface of the second portion 242 of the coupling pin 240. The male threads 243 of the coupling pin 240 may correspond to female threads (not shown) formed on the inner surface of the base 110. That is, the male threads 243 of the coupling pin 240 may engage with female threads formed on the inner surface of the coupling portion 113 of the base 110.

Figure 4A:
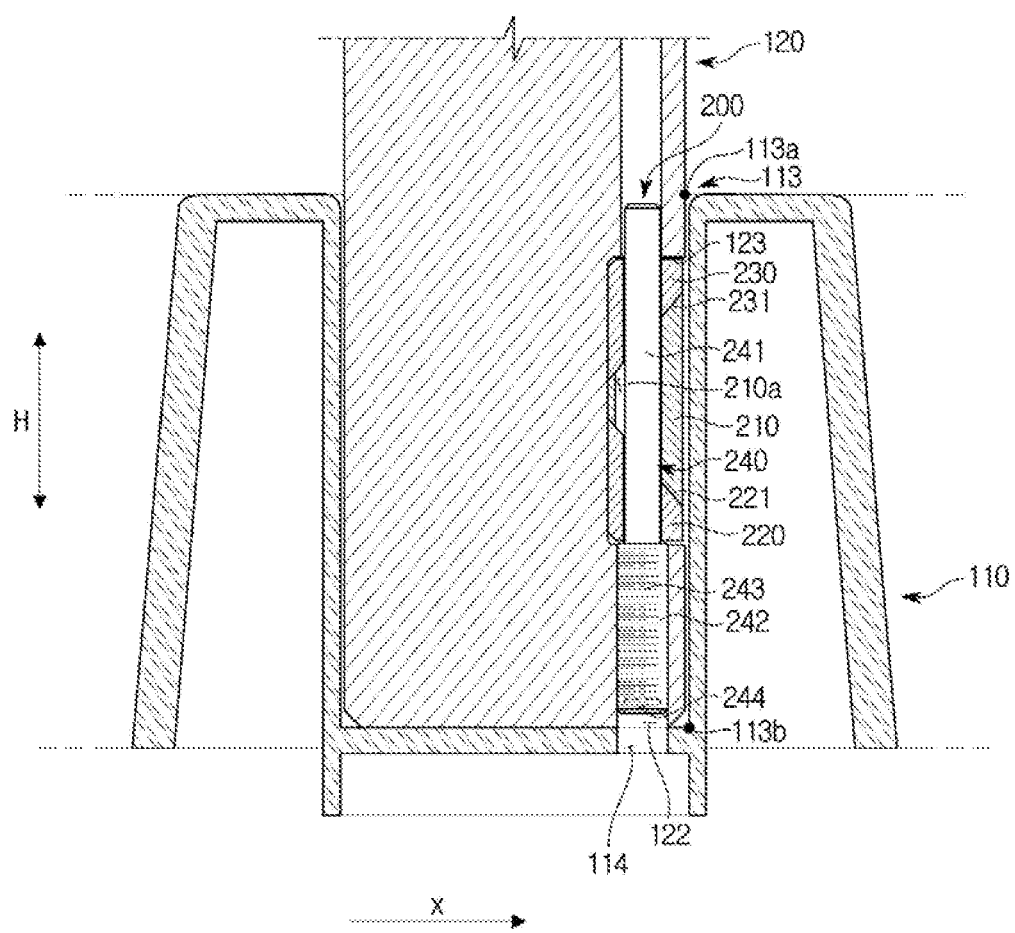
FIGS. 4A and 4B are views schematically illustrating an operation process of the movement preventing unit according to the first embodiment.
Figure 4B:
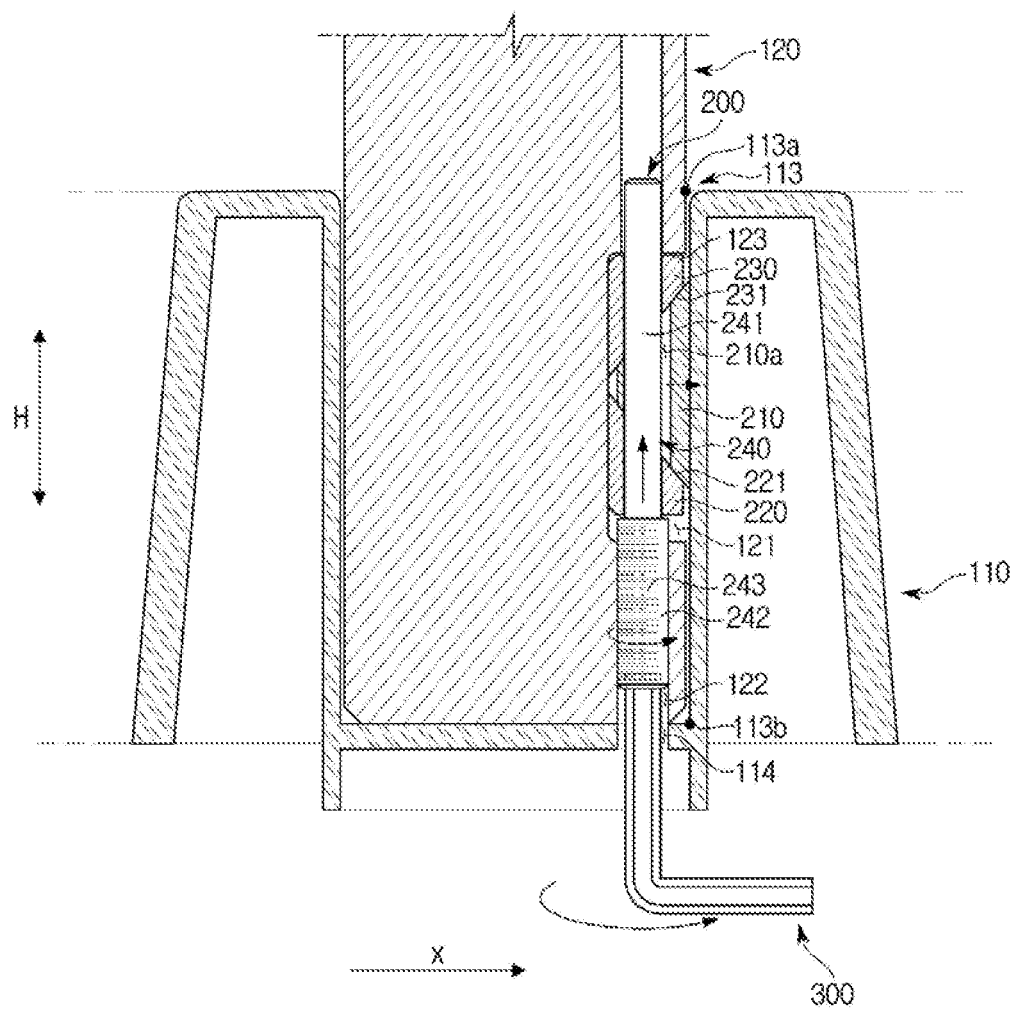

FIGS. 4A and 4B are views schematically illustrating an operation process of the movement preventing unit according to the first embodiment.

As illustrated in FIGS. 4A and 4B, the movement preventing unit 200 may be disposed inside the support bar 120. Specifically, the movement preventing unit 200 may be accommodated in an accommodation space 122 provided inside the support bar 120. The accommodation space 122 of the movement preventing unit 200 may be provided adjacent to the opening 121.

The support bar 120 may be coupled to the base 110 in a state in which the movement preventing unit 200 is accommodated inside the support bar 120. Specifically, the support bar 120 may be inserted into the coupling portion 113 of the base 110 in a state in which the movement preventing unit 200 is accommodated inside the support bar 120. The support bar 120 inserted into the coupling portion 113 of the base 110 may be coupled to the base 110 by the fixing member 130. When the support bar 120 is coupled to the base 110, the movement preventing unit 200 may be operated using a tool 300 to reduce the gap between the support bar 120 and the base 110. The tool 300 may be inserted into the insertion hole 114 formed on the bottom surface of the base 110 to press the movement preventing unit 200 upward in the height direction H of the stand 100. As an example, the tool 300 may include a hexagon wrench, and the tool 300 may be fastened to a fastening groove 244 formed on the coupling pin 240. When the tool 300 is rotated in a state in which the tool 300 is fastened to the fastening groove 244 of the coupling pin 240, the coupling pin 240 moves upward in the height direction H of the stand 100. At this time, the upward movement of the second guide block 230 in the height direction H of the stand 100 is restricted by interference with a locking jaw 123 formed on an inner surface of the support bar 120, and the first guide block 220 is pushed upward in the height direction H of the stand 100 by the coupling pin 240. The upward movement of the moving block 210 in the height direction H of the stand 100 is restricted by the second guide block 230, and the moving block 210 protrudes through the opening 121 by moving along the first inclined surface 221 of the first guide block 220 and the second inclined surface 231 of the second guide block 230. The moving block 210 protruding through the opening 121 may be in contact with the inner surface of the coupling portion 113 of the base 110. The degree of protrusion of the moving block 210 may be determined by a size of the coupling hole 210a of the moving block 210.

As such, the gap between the support bar 120 and the base 110 may be reduced by the moving block 210 being in close contact with the inner surface of the coupling portion 113.

The coupling portion 113 of the base 110 may include a first end portion 113a facing upward in the height direction H of the stand 100 and a second end portion 113b facing downward in the height direction H of the stand 100. Appropriately, the moving block 210 may protrude through the opening 121 to be in contact with the first end 113a of the coupling portion 113 or the inner surface of the coupling portion 113 adjacent to the first end 113a of the coupling portion 113. Through this structure, the moving block 210 may be prevented from being exposed to the outside, and at the same time, the coupling between the support bar 120 and the base 110 may be maintained more securely.

Figure 5A:
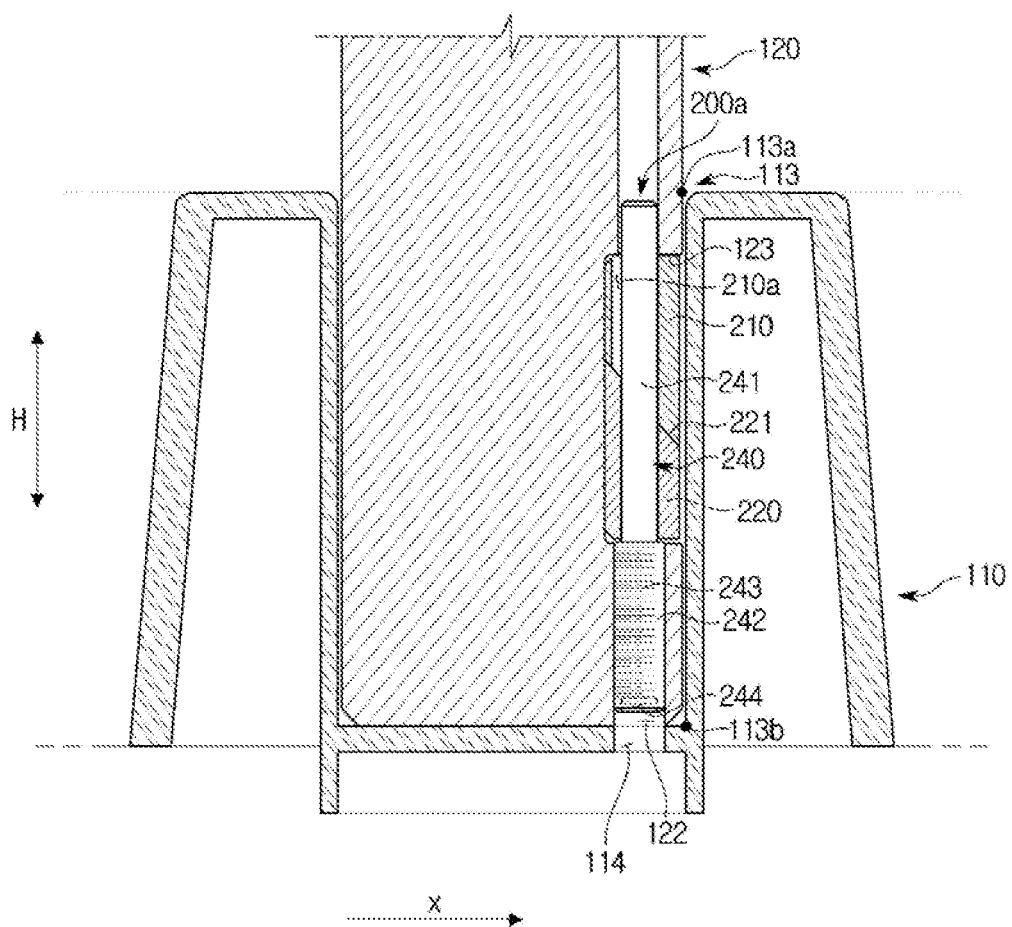
FIGS. 5A and 5B are views schematically illustrating an operation process of a movement preventing unit according to a second embodiment.
Figure 5B:
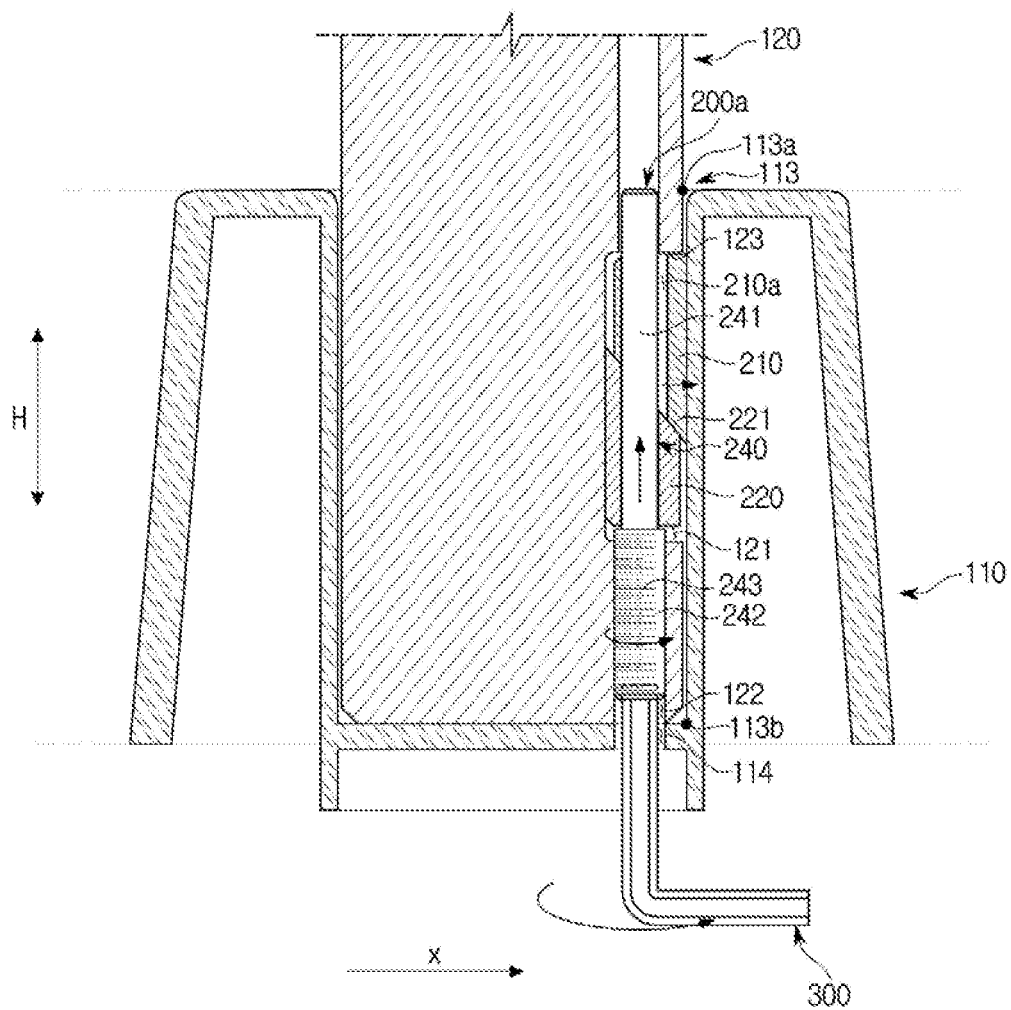

FIGS. 5A and 5B are views schematically illustrating an operation process of a movement preventing unit according to a second embodiment. Hereinafter, descriptions overlapping with those described in FIGS. 4A and 4B may be omitted.

As illustrated in FIGS. 5A and 5B, a movement preventing unit 200a may include the moving block 210 and the guide block 220 positioned below the moving block 210 in the height direction H of the stand 100. The guide block 220 may include the inclined surface 221 inclined upward in the height direction H of the stand 100 with respect to the protruding direction X of the moving block 210.

The support bar 120 may be inserted into the coupling portion 113 of the base 110 in a state in which the movement preventing unit 200a is accommodated inside the support bar 120. The support bar 120 inserted into the coupling portion 113 of the base 110 may be coupled to the base 110 by the fixing member 130. When the support bar 120 is coupled to the base 110, the movement preventing unit 200a may be operated using the tool 300 to reduce the gap between the support bar 120 and the base 110. When the tool 300 is rotated in a state in which the tool 300 is fastened to the fastening groove 244 of the coupling pin 240, the coupling pin 240 moves upward in the height direction H of the stand 100. At this time, the upward movement of the moving block 210 in the height direction H of the stand 100 is restricted by interference with the locking jaw 123 formed on the inner surface of the support bar 120, and the moving block 210 protrudes through the opening 121 by moving along the inclined surface 221 of the guide block 220. The moving block 210 protruding through the opening 121 may be in close contact with the inner surface of the coupling portion 113 of the base 110.

Figure 6A:
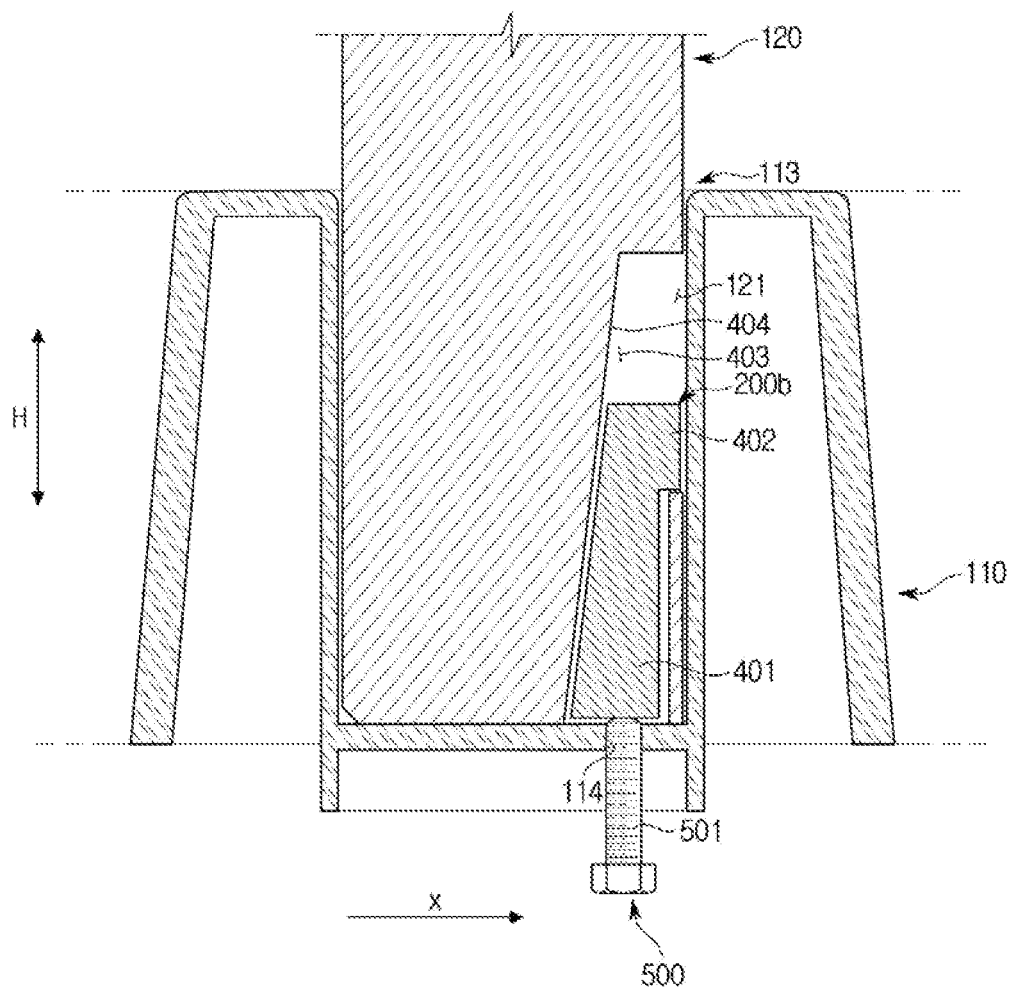
FIGS. 6A and 6B are views schematically illustrating an operation process of a movement preventing unit according to a third embodiment.
Figure 6B:
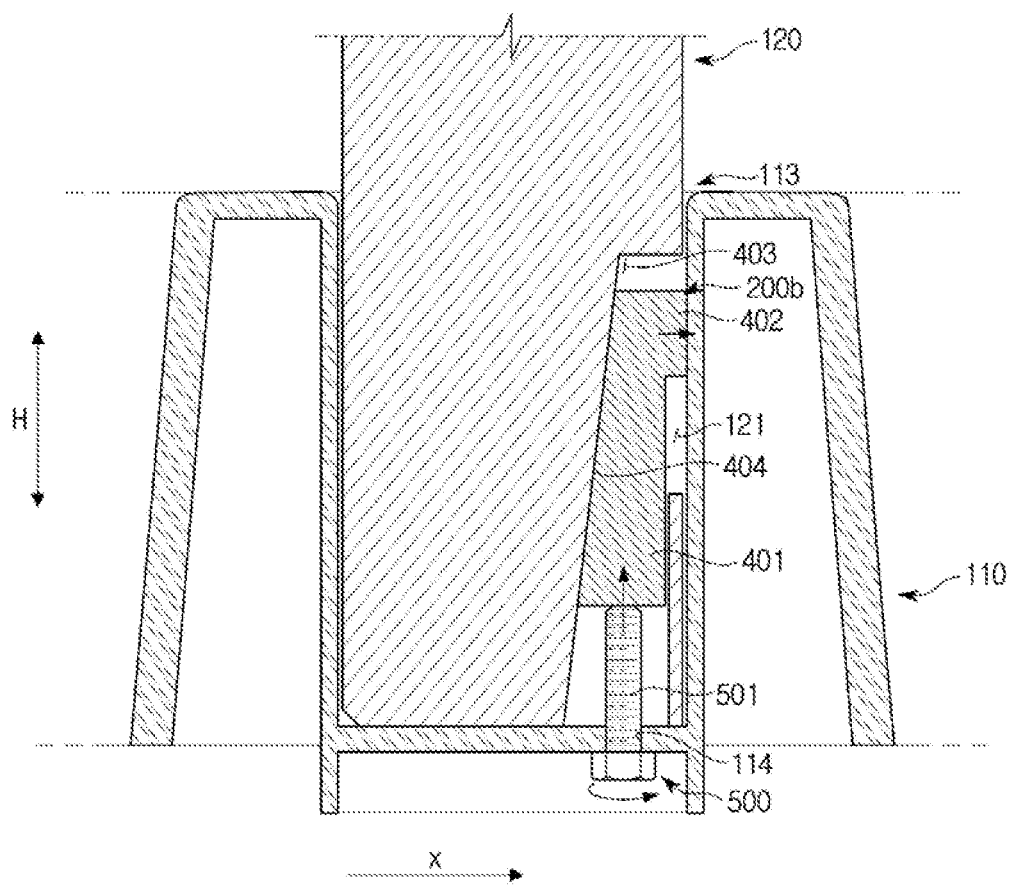

FIGS. 6A and 6B are views schematically illustrating an operation process of a movement preventing unit according to a third embodiment.

As illustrated in FIGS. 6A and 6B, a movement preventing unit 200b may include a body 401 and a head 402 extending from the body 401 in the protruding direction X of the movement preventing unit 200b. The movement preventing unit 200b may be accommodated inside the support bar 120 such that the movement preventing unit 200b may protrude through the opening 121 formed on the support bar 120. That is, the movement preventing unit 200b may be accommodated in an accommodation space 403 of the support bar 120. The accommodation space 403 may be provided with an inclined surface 404 along which the movement preventing unit 200b moves. Specifically, the inclined surface 404 may be inclined in the protruding direction X of the movement preventing unit 200b with respect to the height direction H of the stand 100.

The support bar 120 may be inserted into the coupling portion 113 of the base 110 in a state in which the movement preventing unit 200b is accommodated inside the support bar 120. The support bar 120 inserted into the coupling portion 113 of the base 110 may be coupled to the base 110 by the fixing member 130. When the support bar 120 is coupled to the base 110, the movement preventing unit 200b may be operated using a fastening member 500 to reduce the gap between the support bar 120 and the base 110. As an example, the fastening member 500 may include a screw. When the fastening member 500 is inserted into the insertion hole 114 formed on the bottom surface of the base 110 and then rotated, the movement preventing unit 200b is pushed upward in the height direction H of the stand 100. The movement preventing unit 200b may move upward in the height direction H of the stand 100 along the inclined surface 404 of the accommodation space 403, and the head 402 of the movement preventing unit 200b may protrude through the opening 121 to be in close contact with the inner surface of the coupling portion 113 of the base 110. The fastening member 500 is fixed to the bottom surface of the base 110 by the engagement between female threads 501 formed on an outer surface of the fastening member 500 and male threads (not shown) formed on the inner surface of the insertion hole 114 of the base 110 to support the movement preventing unit 200b.

Figure 8:
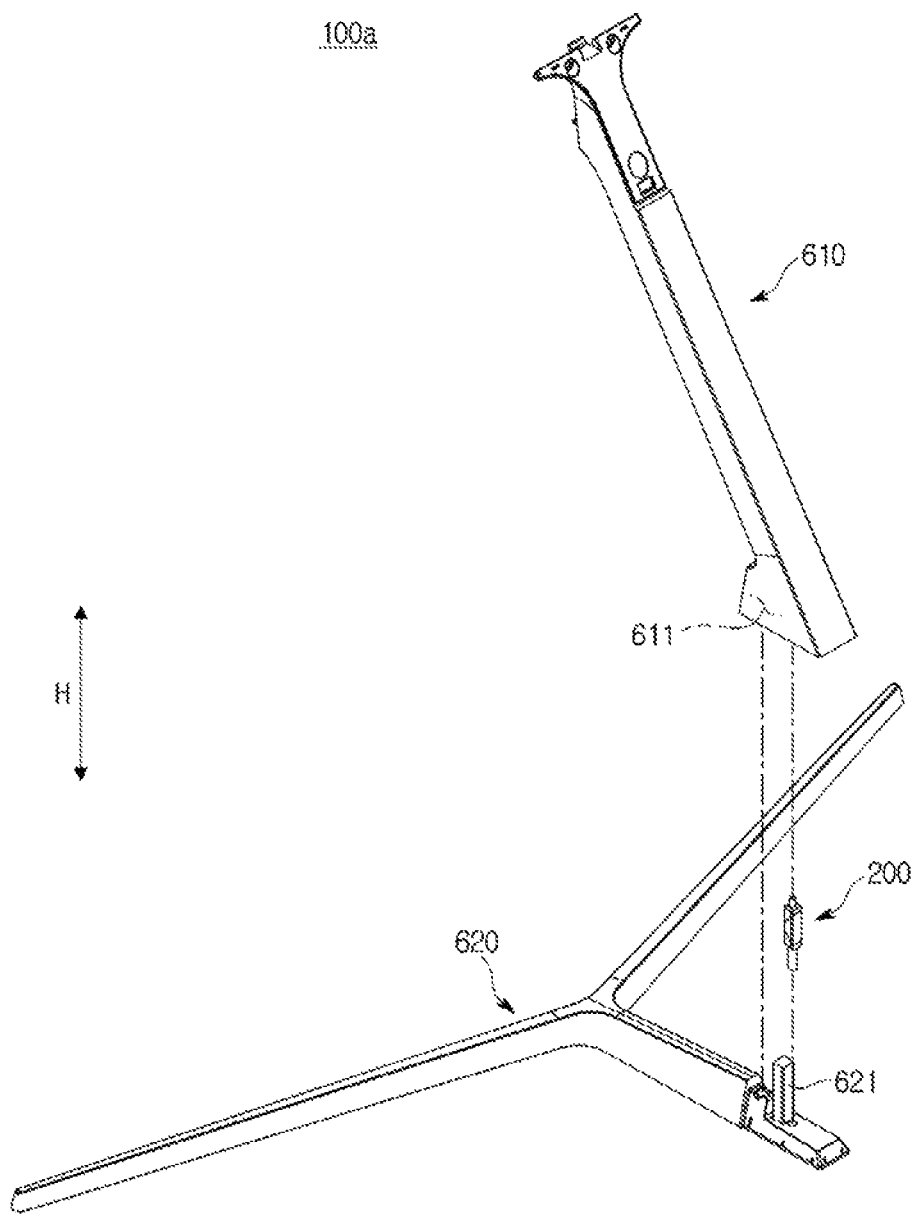
FIG. 8 is an exploded perspective view of a stand of the display apparatus according to another embodiment of the present disclosure.

FIG. 7 illustrates a display apparatus according to another embodiment of the present disclosure, and FIG. 8 is an exploded perspective view of a stand of the display apparatus according to another embodiment of the present disclosure. Hereinafter, descriptions overlapping with those described in FIGS. 1 to 4B may be omitted.

As illustrated in FIGS. 7 and 8, a display apparatus 1a may include the display module 10 and a stand 100a configured to allow the display module 10 to be mounted. The display module 10 is the same as that of FIG. 1 and thus a description thereof is omitted. However, unlike the electronic blackboard illustrated in FIG. 1, the display apparatus 1a illustrated in FIG. 7 is a television, and therefore the touch screen method may not be applied.

The stand 100a may include an upper frame 610 and a lower frame 620 coupled to the upper frame 610 to form an outer appearance of the stand 100a. The upper frame 610 may be configured to allow the display module 10 to be mounted. In other words, the display module 10 may be coupled to the upper frame 610. The lower frame 620 may be disposed on an installation surface.

The upper frame 610 may include a coupling portion 611 to which the lower frame 620 is coupled. The coupling portion 611 may be recessed in the upper frame 610 to have a predetermined depth.

The stand 100a may further include the movement preventing unit 200 configured to reduce a gap between the upper frame 610 and the lower frame 620. Specifically, the stand 100a may further include the movement preventing unit 200 configured to reduce a gap between the coupling portion 611 and the lower frame 620. The movement preventing unit 200 may be positioned between the upper frame 610 and the lower frame 620. As an example, the movement preventing unit 200 may be provided on the lower frame 620. However, the position of the movement preventing unit 200 is not limited to the lower frame 620, and may be variously changed. As an example, the movement preventing unit 200 may be provided on the upper frame 610. Hereinafter, a description will be given focusing on a case where the movement preventing unit 200 is provided on the lower frame 620.

Figure 9A:
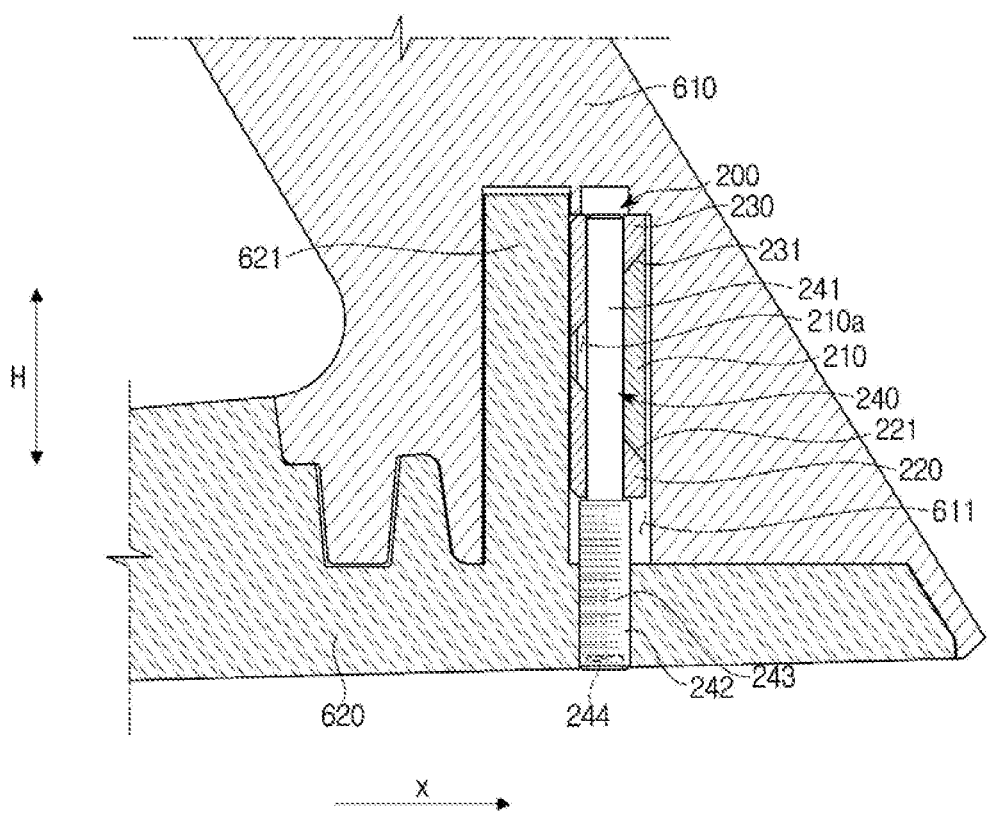
FIGS. 9A and 9B are views schematically illustrating an operation process of a movement preventing unit according to a first embodiment in the stand of the display apparatus according to another embodiment of the present disclosure.
Figure 9B:
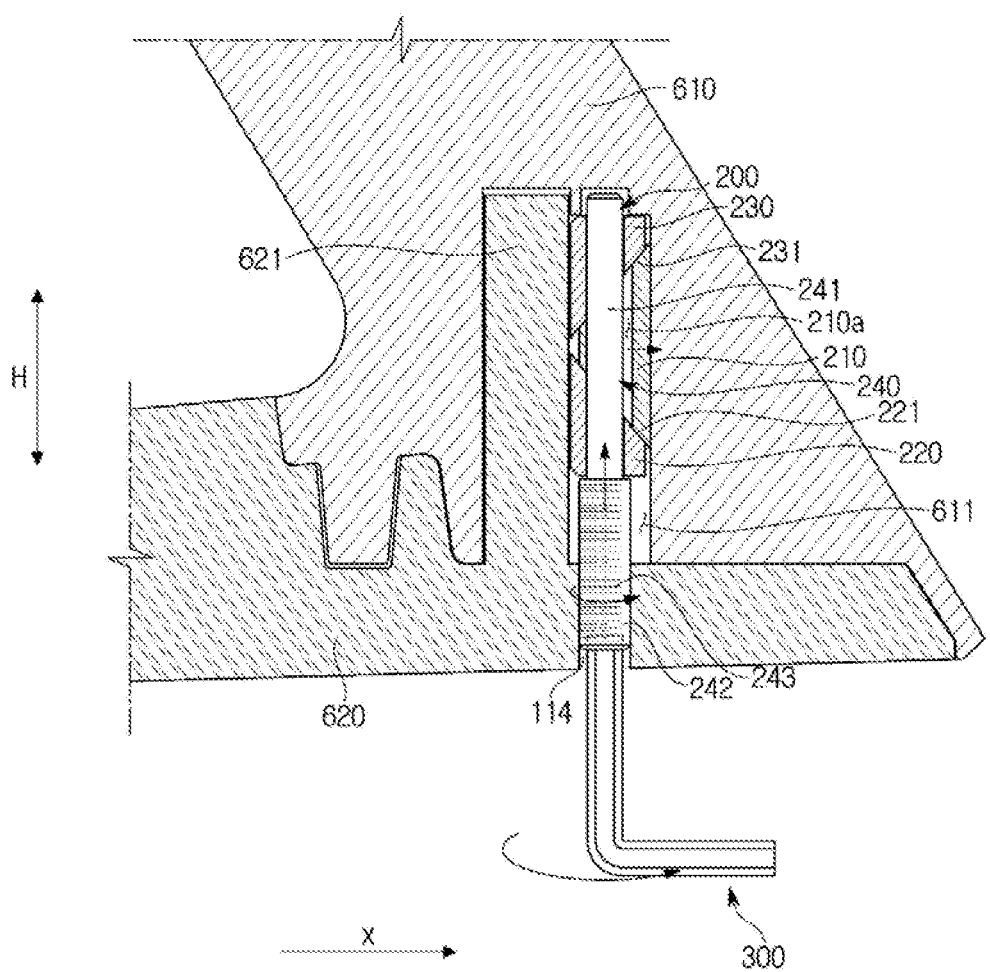

FIGS. 9A and 9B are views schematically illustrating an operation process of a movement preventing unit according to a first embodiment in the stand of the display apparatus according to another embodiment of the present disclosure. Hereinafter, descriptions overlapping with those described in FIGS. 4A and 4B may be omitted.

As illustrated in FIGS. 9A and 9B, the upper frame 610 may be coupled to the lower frame 620 in a state where the movement preventing unit 200 is disposed on the lower frame 620. In this case, a protrusion 621 extending from a bottom surface of the lower frame 620 may be inserted into the coupling portion 611 of the upper frame 610. The movement preventing unit 200 may be positioned in the front of the protrusion 621 of the lower frame 620 in the protruding direction X of the movement preventing unit 200 and may be inserted into the coupling portion 611 of the upper frame 610 together with the protrusion 621 of the lower frame 620. When the lower frame 620 and the upper frame 610 are coupled, the movement preventing unit 200 may be operated using the tool 300 to reduce the gap between the lower frame 620 and the upper frame 610. The tool 300 may be inserted into the insertion hole 114 formed on the bottom surface of the lower frame 620 to press the movement preventing unit 200 upward in the height direction H of the stand 100a. The tool 300 may be fastened to the fastening groove 244 formed on the coupling pin 240. When the tool 300 is rotated in a state in which the tool 300 is fastened to the fastening groove 244 of the coupling pin 240, the coupling pin 240 moves upward in the height direction H of the stand 100a. At this time, the upward movement of the second guide block 230 in the height direction H of the stand 100a is restricted by interference with a locking jaw 612 formed on an inner surface of the coupling portion 611, and the first guide block 220 is pushed upward in the height direction H of the stand 100a by the coupling pin 240. The upward movement of the moving block 210 in the height direction H of the stand 100a is restricted by the second guide block 230, and the moving block 210 protrudes by moving along the first inclined surface 221 of the first guide block 220 and the second inclined surface 231 of the second guide block 230 to be in contact with the inner surface of the coupling portion 611.

As such, the gap between the upper frame 610 and the lower frame 620 may be reduced by the moving block 210 being in close contact with the inner surface of the coupling portion 611.

While the present disclosure has been particularly described with reference to exemplary embodiments, it should be understood by those of skilled in the art that various changes in form and details may be made without departing from the spirit and scope of the present disclosure.

The invention claimed is:

1. A stand, which is configured to support a display module, comprising:
a base comprising a coupling portion;
a support bar on which the display module is mounted, the support bar being inserted into the coupling portion to couple to the base, and comprising an opening formed on a side surface of the support bar to face an inner surface of the coupling portion; and
a movement preventing unit disposed inside the support bar, and configured to reduce a gap between the base and the support bar,
wherein the movement preventing unit comprises:
a moving block configured to protrude through the opening,
a first guide block positioned below the moving block in a height direction H of the stand and comprising a first inclined surface inclined upward in the height direction H of the stand with respect to a protruding direction X of the moving block, and
a second guide block positioned above the moving block in the height direction H of the stand and comprising a second inclined surface inclined downward in the height direction H of the stand with respect to the protruding direction X of the moving block,
wherein the moving block is configured to protrude through the opening to be in contact with the inner surface of the coupling portion when the movement preventing unit is pressed upward in a height direction H of the stand.

2. The stand according to claim 1, wherein
the movement preventing unit further comprises a coupling pin penetrating the moving block and the guide block to prevent at least one of the moving block and the guide block from being separated from the support bar through the opening.

3. The stand according to claim 2, wherein
a coupling hole in which the coupling pin is coupled and which is open lengthwise along the protruding direction X of the moving block is formed on the moving block.

4. The stand according to claim 2, wherein
male threads are formed on an outer surface of the coupling pin, and
female threads engaged with the male threads are formed on an inner surface of the support bar.

5. The stand according to claim 1, wherein
the base further comprises an insertion hole formed on a bottom surface thereof, and
the moving block protrudes through the opening to be in contact with the inner surface of the coupling portion when the movement preventing unit is pressed by a tool inserted in the insertion hole.

6. The stand according to claim 5, further comprising
a fixing member configured to couple the base and the support bar,
wherein the fixing member is coupled to a fixing hole formed on the bottom surface of the base to be adjacent to the insertion hole.

7. The stand according to claim 1, wherein
the coupling portion of the base comprises a first end facing upward in a height direction H of the stand, and a second end facing downward in the height direction H of the stand, and
the moving block protrudes through the opening to be in contact with the first end of the coupling portion or an inner surface of the coupling portion adjacent to the first end of the coupling portion.

* * * * *